(12) United States Patent
Boger et al.

(10) Patent No.: US 7,433,749 B2
(45) Date of Patent: Oct. 7, 2008

(54) ADHESIVE SYSTEM CONFIGURATION TOOL

(75) Inventors: Bentley Boger, Atlanta, GA (US); Paul Brusko, Flowery Branch, GA (US); Alan Ramspeck, Cumming, GA (US)

(73) Assignee: Nordson Corporation, Westlake, OH (US)

( * ) Notice: Subject to any disclaimer, the term of this patent is extended or adjusted under 35 U.S.C. 154(b) by 281 days.

(21) Appl. No.: 11/275,761

(22) Filed: Jan. 27, 2006

(65) Prior Publication Data

US 2007/0179643 A1    Aug. 2, 2007

(51) Int. Cl.
  G06F 19/00   (2006.01)
  G06F 17/50   (2006.01)
  G06F 3/048   (2006.01)
  G05B 11/01   (2006.01)
  A01K 5/02    (2006.01)

(52) U.S. Cl. .................. 700/103; 700/17; 700/117; 700/121; 705/29; 715/769

(58) Field of Classification Search .................. 700/17, 700/83, 95, 97, 103, 117, 121, 213, 231; 705/1, 28, 29, 400, 418; 713/1, 100; 715/700, 715/769, 770; 345/418
See application file for complete search history.

(56) References Cited

U.S. PATENT DOCUMENTS

| | | | | |
|---|---|---|---|---|
| 5,742,288 A | * | 4/1998 | Nishizaka et al. ............ 345/418 |
| 5,841,659 A | * | 11/1998 | Tanaka et al. ............... 700/121 |
| 6,018,627 A | | 1/2000 | Iyengar et al. |
| 6,144,954 A | * | 11/2000 | Li ............................ 706/62 |
| 6,269,473 B1 | | 7/2001 | Freed et al. |
| 6,345,382 B1 | | 2/2002 | Hughes |
| 6,819,967 B2 | * | 11/2004 | Ballas et al. ................ 700/107 |
| 6,944,580 B1 | * | 9/2005 | Blume et al. .................. 703/1 |
| 6,978,435 B2 | * | 12/2005 | Anderson et al. ............. 716/17 |
| 7,039,511 B1 | * | 5/2006 | Kreuz et al. .................. 701/36 |
| 7,065,476 B2 | * | 6/2006 | Dessureault et al. .......... 703/2 |
| 7,206,651 B2 | * | 4/2007 | Takemura et al. ............. 700/94 |
| 2001/0039536 A1 | * | 11/2001 | Mori et al. .................. 705/400 |
| 2002/0120490 A1 | * | 8/2002 | Gajewski et al. ............. 705/10 |
| 2002/0156757 A1 | * | 10/2002 | Brown ......................... 707/1 |
| 2003/0065488 A1 | * | 4/2003 | Beckert et al. ................ 703/1 |
| 2004/0249770 A1 | * | 12/2004 | Yeh et al. .................... 705/400 |
| 2005/0228759 A1 | * | 10/2005 | King .......................... 705/400 |
| 2006/0178864 A1 | * | 8/2006 | Khanijo et al. ............... 703/20 |
| 2006/0259172 A1 | * | 11/2006 | Trammell et al. ............. 700/97 |

* cited by examiner

Primary Examiner—Crystal Barnes Bullock
(74) Attorney, Agent, or Firm—Wood, Herron & Evans, L.L.P.

(57) ABSTRACT

A computerized design system for configuring an adhesive dispensing configuration. The system enables a user to graphically or otherwise manipulate markers representative of dispensing components. Programmatic rules associated with the markers guide the design process by ensuring and/or prompting compatible and otherwise appropriate marker selections for inclusion in the design.

21 Claims, 5 Drawing Sheets

ADHESIVE SYSTEM CONFIGURATION TOOL

FIELD OF THE INVENTION

The present invention relates generally to adhesive dispensing systems, and more particularly, to processes used to configure such dispensing systems.

BACKGROUND OF THE INVENTION

Adhesive dispensing systems involve complex coordination and interactions between sophisticated, specialized machinery. Most systems rely at a minimum on a combination of components, such as melters, applicators, drum unloaders, hoses, and controllers, among others, to apply adhesive onto a substrate. To maximize efficiency, each component of a dispensing system is optimized to function with other specialized components of the system. For example, the length of extension cables may be selected to complement the length of hoses. The length and diameter of a hose is often selected according to which size functions best with a selected temperature sensor. In another example, the nozzle selection depends upon whether a contact or spray applicator is used.

As can be appreciated, designing an adhesive dispensing system requires extensive know-how and familiarity with a broad range of components. A planner customizing a dispensing system must account for the numerous interactions and compatibility issues involved with the spectrum of potential components. As another example, even experienced designers have to conduct an extensive review of various manuals to determine, for instance, what applicator wattage load is appropriate or even allowed with a desired melter capacity. This process is not only time consuming, but is prone to error. Such inefficiency becomes more problematic in a sales situation, where a potential client must patiently wait for the salesman to create a working design.

There is a consequently a need for a more efficient manner of designing an adhesive dispensing system.

SUMMARY OF THE INVENTION

The present invention provides a computer implemented method, apparatus, program product for configuring an adhesive dispensing system. A dispensing system may be configured by displaying and manipulating markers, i.e., graphical symbols and/or text representative of components used in an adhesive dispensing system. A first marker is associated with a programmatic rule that is used to determine whether the first marker should be displayed in an associated relationship with a second marker. For instance, the programmatic rule may stipulate that a marker representative of a process extension cable can only be logically associated with a marker representative of an air-assisted, non-contact applicator.

During a design process, the user is allowed to select the first marker for potential combination with the second marker. Program code is used to determine whether the potential combination is appropriate. In another example, whether a nickel or platinum temperature sensor is selected will affect whether a particular melter is determined to be appropriate. If the combination is determined to be appropriate in view of the applicable programmatic rule, the then the first and second markers are logically connected, or are otherwise displayed in an associated relationship. A typical associated relationship, or connection, comprises a display of markers in relatively close spatial relation, e.g., symbols touching, or text arranged in a list or paragraph.

Should the potential combination alternatively be determined inappropriate, then a fail signal is generated. The user may then be prompted to select another marker. Where desired, one or more appropriate markers may be automatically determined and displayed to the user. The design system may determine the markers from previously selected markers, including parameters descriptive of specific features of the previously selected markers.

In this manner, features of the present invention may lead, or guide, a user's selection of markers. In another aspect of the invention, a programmatic rule associated with a first marker as above is used to determine a viable, second marker based on an initial selection of the first marker. The automatically determined second marker(s) is/are subsequently displayed to the user for selection.

A graphical user interface (GUI) may be utilized to drag and drop, or otherwise select and spatially arrange markers comprising symbols. Where markers alternatively comprise text, text markers may be presented to the user, e.g., manufacturer representative or customer, for their selection and eventual incorporation into a design. A typical marker may be representative of a melter, a hose, an applicator, a nozzle, an extension hose, a drum unloader, a sensor, and a meter, among other components. To this end, a database or other repository of markers and associated programmatic rules may be maintained within a memory.

A design comprising the associated relationship between the first and second markers may be saved within memory, and/or printed out. A cost proposal based on the first and second markers may be generated automatically in response to a user query. Likewise, predictions regarding installation time based on the first and second markers may be automatically determined, or may be determined in response to a user query.

In yet another aspect of the invention, program code is configured to display a plurality of markers representative of components used in an adhesive dispensing system. A first marker is associated with a programmatic rule used to determine whether the first marker should be displayed in an associated relationship with a second marker. The program code is further configured to enable a user to select the first marker for a potential combination with the second marker, and to determine if the potential combination is appropriate. If so, the program code displays the first and second markers in the associated relationship. A computer readable medium bearing the program code may also be used. Another aspect of the invention includes program code configured to enable a user to select a first marker, and to automatically determine a second marker using the programmatic rule.

By virtue of the foregoing there is thus provided an improved computer implemented method, apparatus and program product for configuring an adhesive design system. More particularly, processes provide more streamlined and efficient designs, reducing manpower effort and cost. These and other advantages of the present invention shall be made apparent from the accompanying drawings and the description thereof.

BRIEF DESCRIPTION OF THE DRAWINGS

The accompanying drawings, which are incorporated in and constitute a part of this specification, illustrate embodiments of the invention and, together with the general description of the invention given above and the detailed description of the embodiments given below, serve to explain the principles of the present invention.

DETAILED DESCRIPTION OF DRAWINGS

Figure 1:
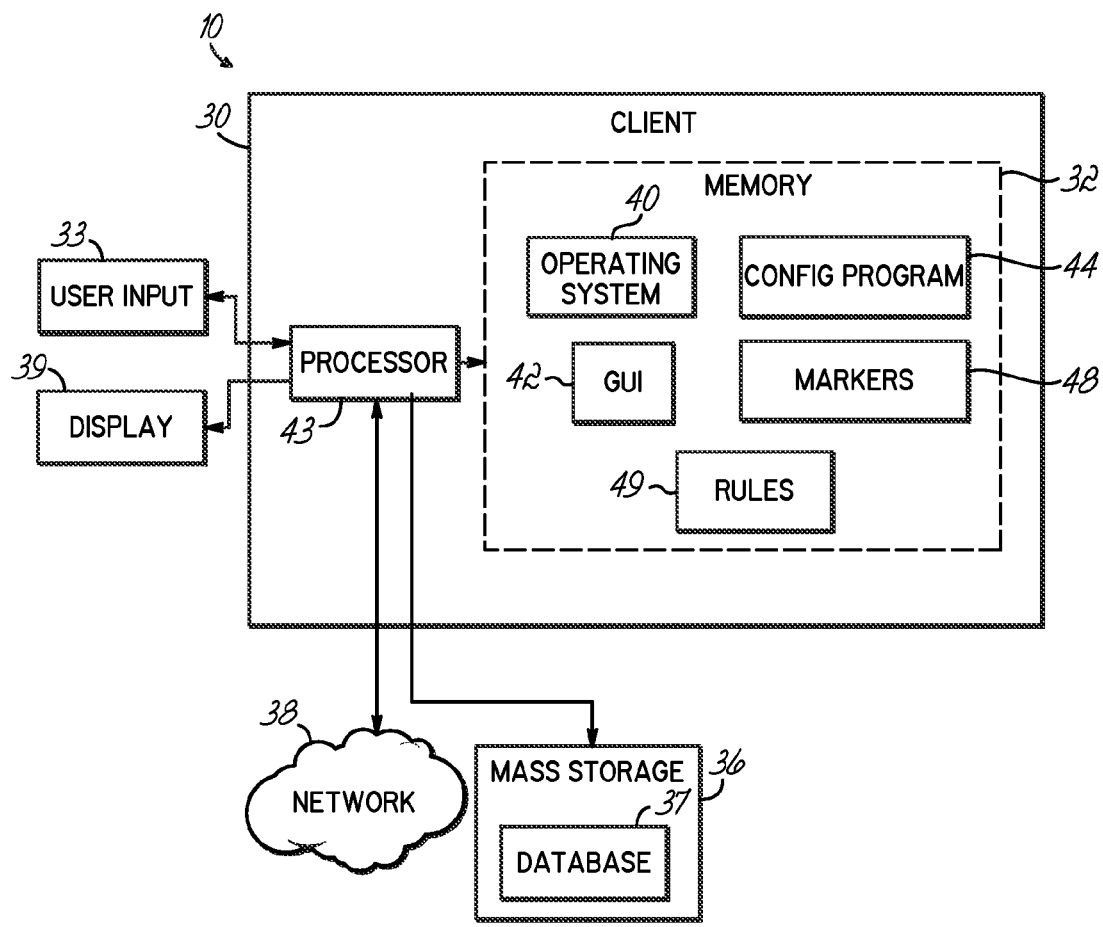
FIG. 1 is a block diagram of a computer system for configuring an adhesive dispensing system.

FIG. 1 illustrates a computer-aided design system 10 for configuring an adhesive dispensing system. The system 10 enables a user to graphically or otherwise manipulate markers representative of dispensing components. Programmatic rules associated with the markers guide the design process by ensuring and/or prompting compatible and otherwise appropriate marker selections for inclusion in the design.

FIG. 1 more particularly shows a networked computer system 10 comprising one or more client computer(s) 30 coupled to a network 38. Network 38 represents a networked interconnection, including, but not limited to local-area, wide-area, wireless, and public networks (e.g., the Internet). Moreover, any number of computers and other devices may be networked through network 38, e.g., multiple servers (not shown). Computer system 10 will hereinafter also be referred to as a "apparatus," "computer," or "design system," although it should be appreciated that the terms may respectively include many other controller configurations. Moreover, while only one computer 30 is shown in FIG. 1, any number of computers and other devices may be networked through network 38. In still another embodiment, the system could be implemented in a stand-alone configuration, i.e., disconnected from another computer or computer network.

Computer 30 typically includes at least one processor 43 coupled to a memory 32. Processor 43 may represent one or more processors (e.g., microprocessors), and memory 32 may represent the random access memory (RAM) devices comprising the main storage of computer 30, as well as any supplemental levels of memory, e.g., cache memories, non-volatile or backup memories (e.g., programmable or flash memories), read-only memories, etc. In addition, memory 32 may be considered to include memory storage physically located elsewhere in computer 30, e.g., any cache memory present in processor 43, as well as any storage capacity used as a virtual memory, e.g., as stored within a database 37, or on another computer coupled to computer 30 via network 38.

Computer 30 also may receive a number of inputs and outputs for communicating information externally. For interface with a user, computer 30 typically includes one or more input devices 33 (e.g., a keyboard, a mouse, a trackball, a joystick, a touch pad, iris/fingerprint scanner, and/or a microphone, among others).

The computer 30 additionally includes a display 39 (e.g., a CRT monitor, an LCD display panel, and/or a speaker, among others). It should be appreciated, however, that with some implementations of the computer 30, direct user input and output may not be supported by the computer, and interface with the computer may be implemented through a computer or workstation networked with the computer 30.

For additional storage, computer 30 may also include one or more mass storage devices 36 configured to store, for instance, a database 37. Exemplary devices 36 can include: a floppy or other removable disk drive, a flash drive, a hard disk drive, a direct access storage device (DASD), an optical drive (e.g., a CD drive, a DVD drive, etc.), and/or a tape drive, among others. Furthermore, computer 30 may include an interface with one or more networks (e.g., a LAN, a WAN, a wireless network, and/or the Internet, among others) to permit the communication of information with other computers coupled to the network 38. It should be appreciated that computer 30 typically includes suitable analog and/or digital interfaces between processor 43 and each of components 32, 33, 36, 38 and 39.

Computer 30 operates under the control of an operating system 40, and executes various computer software applications, components, programs, modules, e.g., a GUI program 42 and a configuration program 44, among others. Various applications, components, programs, markers, modules, etc. may also execute on one or more processors in another computer coupled to computer 30 via a network 38, e.g., in a distributed or client-server computing environment, whereby the processing required to implement the functions of a computer program may be allocated to multiple computers over a network.

The memory 32 shown in FIG. 1 includes various data components that may be utilized by the programs to accomplish a system design. As with other memory components described herein, the data may be stored locally as shown in FIG. 1, or may alternatively be remotely accessed. Examples of such data include stored makers 48 and associated parameters, as well as programmatic rules 49.

Though not shown in FIG. 1, one skilled in the art will appreciate that a server computer may include many of the same or similar components as included in the computer 30, where a networked design processes implementation is desired. In such a situation, for example, the server computer may be the adhesive system manufacturer's computer, while computer 30 may be the customer's computer.

The discussion hereinafter will focus on the specific routines utilized to automatically design dispensing systems. In general, the routines executed to implement the embodiments of the invention, whether implemented as part of an operating system or a specific application, component, program, marker, module or sequence of instructions will be referred to herein as "programs," or simply "program code." The programs typically comprise one or more instructions that are resident at various times in various control device memory and storage devices. When a program is read and executed by a processor, the program causes the access control device to execute steps or elements embodying the various aspects of the invention.

Moreover, while the invention has and hereinafter will be described in the context of fully functioning access control devices, such as computer systems, those skilled in the art will appreciate that the various embodiments of the invention are capable of being distributed as a program product in a variety of forms, and that the invention applies equally regardless of the particular type of computer readable media used to actually carry out the distribution. Examples of computer readable media include but are not limited to recordable type media such as volatile and non-volatile memory devices, floppy and other removable disks, hard disk drives, optical disks (e.g., CD-ROM's, DVD's, etc.), among others, and transmission type media such as digital and analog communication links.

In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

Figure 2:
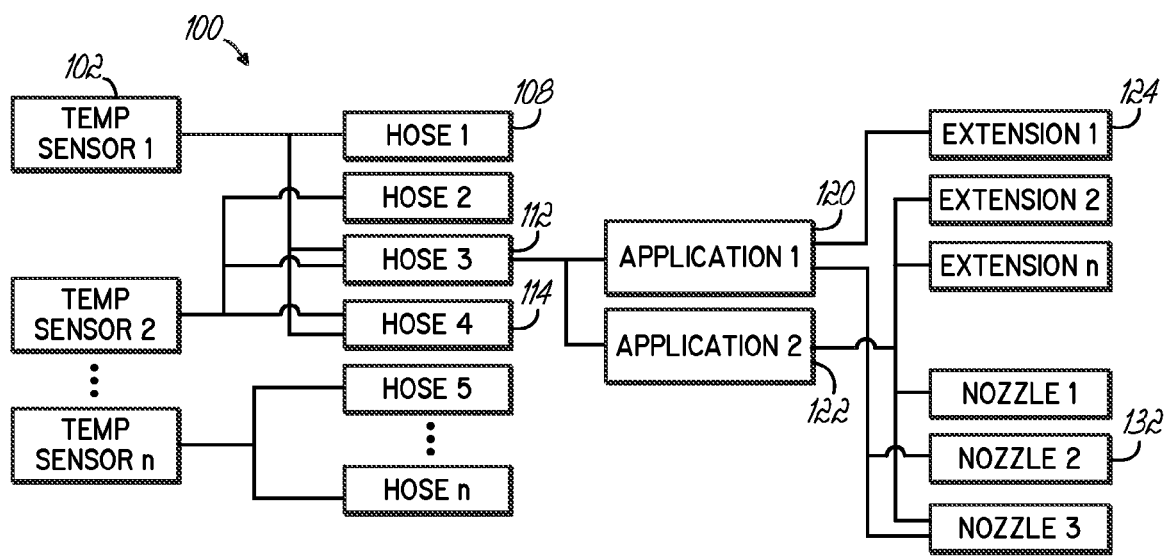
FIG. 2 is a logic diagram showing one manner of implementing the programmatic rules of FIG. 1 within a database memory.

FIG. 2 shows a logic diagram 100 that may be used to implement programmatic rules. The exemplary logic diagram 100 includes programmatic constraints and logical associations such as may be stored within the memory 32 shown in FIG. 1. Such logic as is shown in the diagram 100 may thus comprise a database structure accessed by a processor 32 to determine the appropriateness of potential marker associations/combinations.

An associated relationship may include a display of visual, physical representation, or contact between markers in a graphical user interface environment. The associated relationship, or logical connectivity, may alternatively include two text markers included within a common browser window or smaller display area.

Turning more particularly to the logic diagram 100, user selection of a first temperature sensor 102, may prompt the program 44 to determine that the selected temperature sensor, e.g., a platinum sensor, is combinable with a first, third and fourth type of hose 108, 112, 114. Eventual selection of a particular diameter and length hose 112 may prompt the determination of two appropriate application types 120, 122. Selection of one of the appropriate applications 120, e.g., a spray application, may prompt a determination of appropriate extension hoses 124 and nozzles 132, 134 for potential inclusion within a design.

While the logic diagram 100 shown in FIG. 2 represents one manner of implementing programmatic rules 49, one skilled in the art will appreciate that the rules 49 and associated logic could be translated and downloaded into event tables or other implementations realized within program code. While there are varying levels of detail to event tables, their action can be examined conceptually through simplified examples: "when this event occurs, trigger this action," or more specifically: "when a contact applicator is used, display these hoses for selection."

Figure 3:
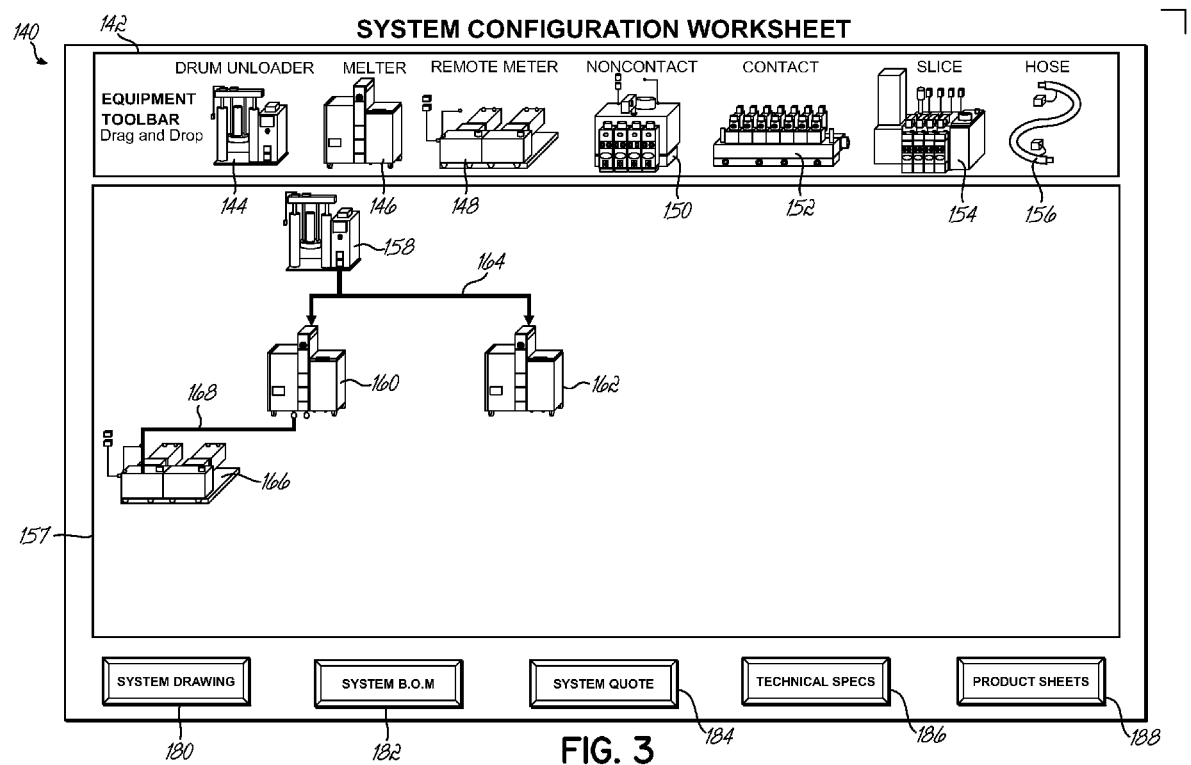
FIG. 3 shows a browser screen that incorporates graphical user interface features to construct a partially complete adhesive dispensing system design plan.

FIG. 3 illustrates an exemplary browser screen 140 that incorporates GUI features. The screen 140 displays a partially completed adhesive dispensing system design. To facilitate the design process, the screen 140 includes a drag and drop equipment toolbar 142 that features symbols, or markers 144, 146, 148, 150, 152, 154, 156, representative of various dispensing components.

Utilizing the user input features of their computer, a user may select a first marker 144 from the toolbar 142. For instance, a user may manipulate their computer mouse to drag a drum unloader marker 158 to a first position in a display field of the screen 140. The marker 158 thus comprises a first component of a design, and is ready for connection to other potential components. Continuing with the present example, the design of the user may require two melters 160, 162. These melters 160, 162 may consequently be selected for inclusion in the display 157 of the browser screen 140.

The user may then select a hose 156 from the equipment toolbar 142 for connecting the melter markers 160, 162 to the unloader marker 158. As discussed below, the selected and displayed hose marker 164 may at this point in the design process generically represent the possibility of many different hose types. The programmatic rules 44 of the system 10 may later specify input for or may automatically determine, for instance, a specific hose length and/or diameter.

Similarly, the user may select a remote meter 148 for inclusion in the proposed design, as shown by marker 166 in the display field 157. Hose 168 may represent a connection between drum unloader marker 160 and the remote meter marker 166.

A series of display features 180, 182, 184, 186 and 188 shown along the bottom of the browser screen 140 present the user with various ways to display information about a potential design. For instance, a user may create and/or display a graphical design of a system, such as is shown in the browser screen 140 shown in FIG. 3, by selecting and operating in system drawing mode 180. The user may alternatively select the button 182 associated with a system bill of material (BOM). The system BOM screen may show itemized costs of each component selected for inclusion within a design.

A more complete cost analysis may be obtained by selecting the system quote button 184. This quote button 184 may additionally bring up estimates regarding installation time. Selection of the technical specifications feature 186 may display a text screen showing parameters, or attributes, associated with each selected component, and product sheets 188 may prompt the display of available sales and advertising material related to components included within the design field 157.

Figure 4:
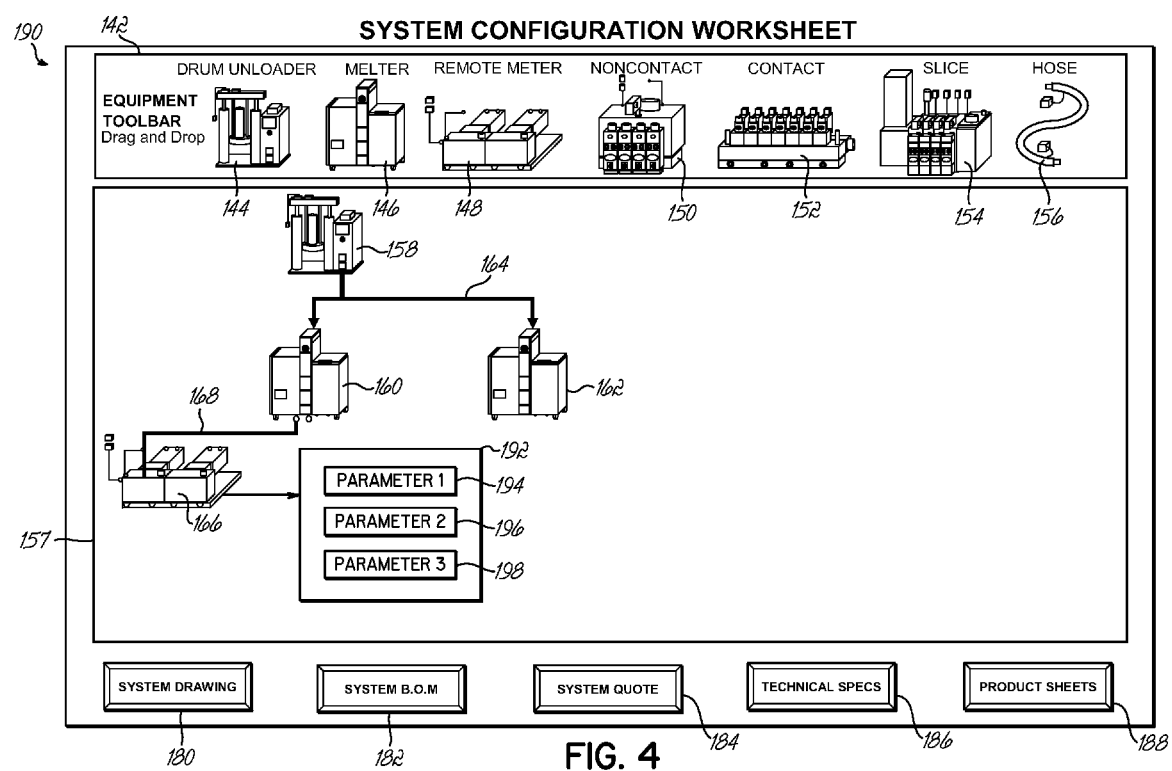
FIG. 4 shows the browser screen of FIG. 3 with a popup window displaying selectable parameters further specifying attributes of a marker.

FIG. 4 illustrates a browser screen 190 graphically showing a next step in the process of configuring the design shown in FIG. 3. The browser screen 190 includes a popup window 192 displaying parameters 194, 196, 198 associated with a given marker 166. Parameters include configurable attributes of an available component. For instance, the parameters 194, 196, 198 may relate to speed settings, i.e., at what speed adhesive is dispensed, available in association with a selected remote meter 166. In another example, parameters include the size specifications of a hose, or the material comprising nozzle. In one embodiment, the parameters 194, 196, 198 may be presented based upon their compatibility with previously-selected markers.

As discussed below in greater detail, selection of such parameters 194, 196, 198 may occur at any time during a design process, but usually occurs after a general design, comprising various generic markers, has already been arranged. The user may then revisit the relatively high level design at a later time to add more specificity. For example, the user is prompted to enter specific parameters to realize optimal cooperation and compatibility between system components.

Figure 5:
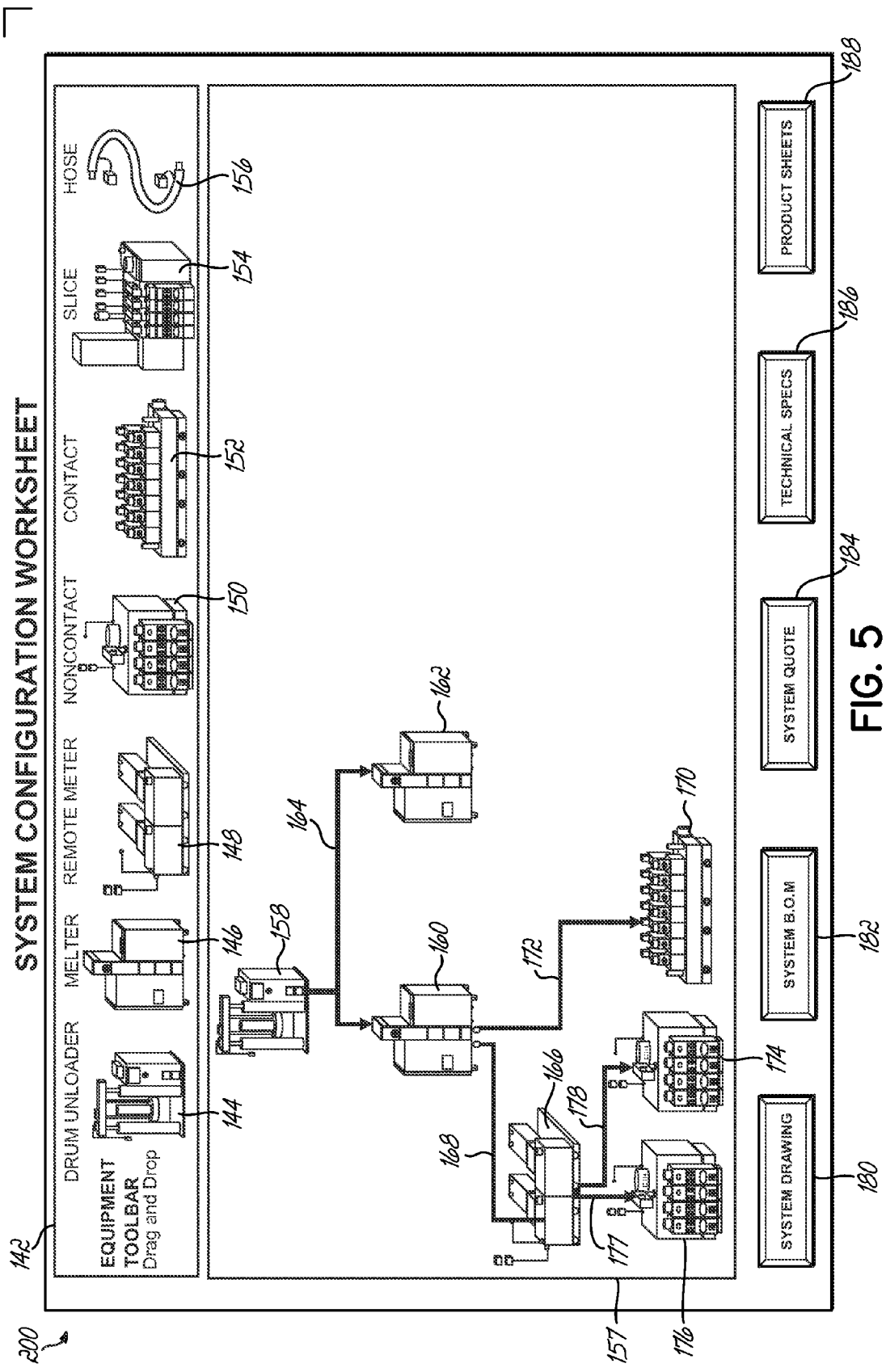
FIG. 5 shows the browser screen of FIG. 3 with a completed dispensing system design plan.

FIG. 5 shows a browser screen 200 with a completed adhesive dispensing system design. As shown in FIG. 5, the system now includes various applicators 170, 174, 176 logically connected to the melter 160 and/or remote meter 166 via hoses 172, 177, 178. The completed plan may ultimately be used to form a system quote and/or may be saved or printed for future consideration.

Those skilled in the art will recognize that the exemplary environments illustrated in FIGS. 1-5 are not intended to limit the present invention. Indeed, those skilled in the art will recognize that other alternative hardware and/or software environments may be used without departing from the scope of the invention.

Figures 6, 7:
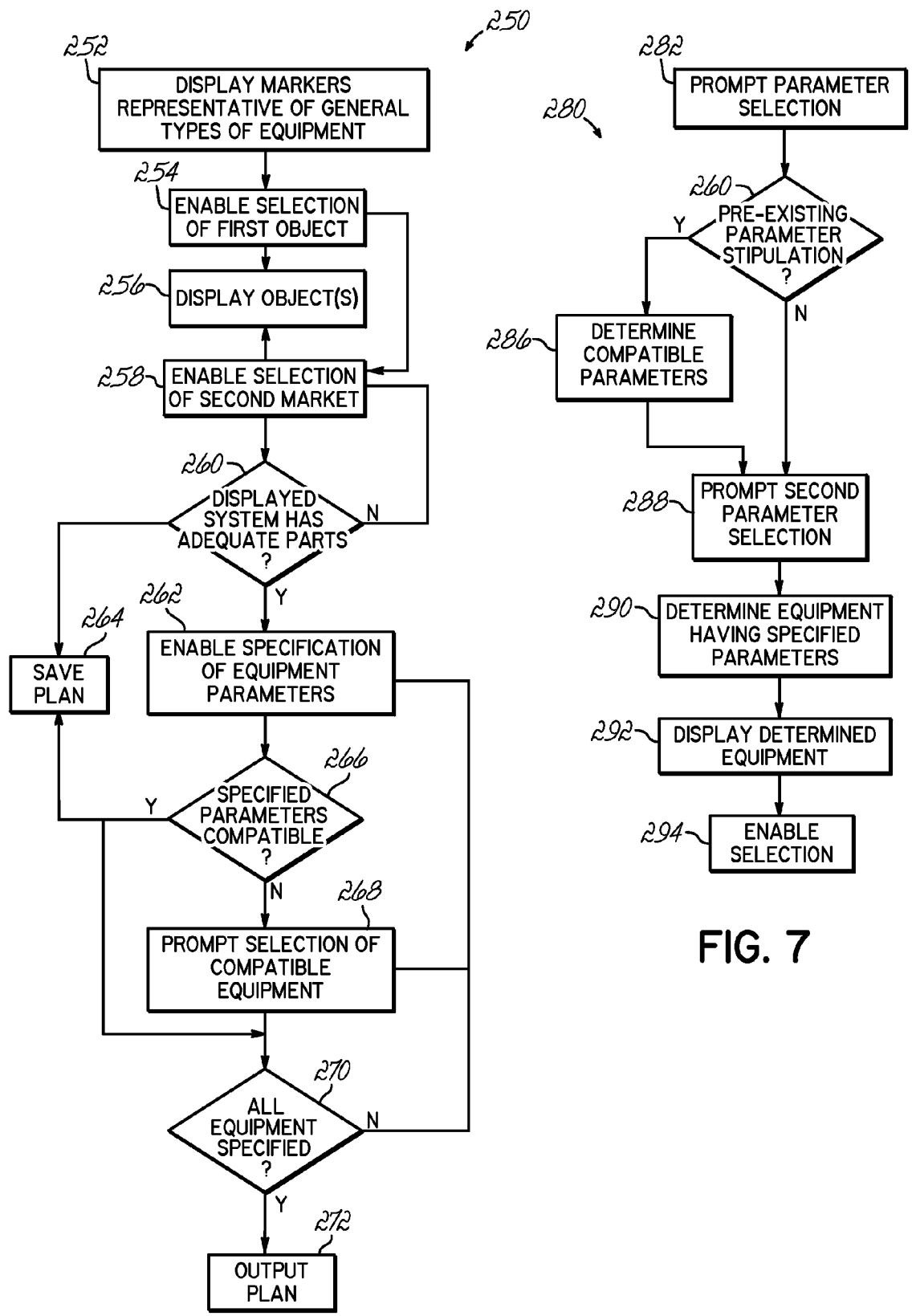
FIG. 6 is a flowchart having steps executable by the system of FIG. 1 for creating and outputting a design plan.
FIG. 7 is a flowchart having steps executable by the system of FIG. 1 for automatically determining a parameter of a marker based on previous parameter and inputs.

The flowchart 250 of FIG. 6 shows an exemplary sequence of steps executable by the system 10 of FIG. 1 for the purpose of creating and outputting a design plan. The steps of the flowchart 250 are shown from the perspective of the computer 30 of FIG. 1. At block 252 of FIG. 6, the computer 30 may display markers 144, 146, 148, 150, 152, 154 and 156 within a toolbar 142 of a browser screen 140. The markers 144, 146, 148, 150, 152, 154 and 156 may be representative of general or model specific types of dispensing equipment.

The system 10 at block 254 of FIG. 6 may enable selection of a first marker. For instance, a user may select from a scroll-down list of text markers. The user may alternatively drag and drop a marker 144. In either case, the computer 30 displays the selected marker at block 256. The user may then select at block 258 a second marker for potential inclusion within the design.

Based on the selection(s) of additional markers, the computer 30 may make at block 260 an initial determination as to whether a proposed design has adequate components. For instance, the computer 30 may check to see that all markers are logically connected to at least one other marker. The computer may additionally or alternatively determine that certain critical parts of a system are included, e.g., an applicator. As such, a certain minimum combination of components may be necessary and capable of being determined automatically by computer 30. As discussed herein, still other components (comprising different parameters) are optional and may be included in response to user input.

Should the computer 30 determine at block 260 that additional parts should be added, then the computer 30 may prompt at block 258 the user to select another marker. Such prompting at block 259 may include flashing text or symbols used to direct the user's selection. In any case, the plan may be saved at block 264.

The computer 30 may enable the user to specify particular equipment parameters at block 262. For instance, the user may double click on a marker 166 to read and select from a listing of operating parameters 194, 196, 198 associated with the marker 166. For instance, a user may specify a particular diameter parameter for a hose marker.

As parameters are chosen at block 262, the computer 30 may determine at block 266 their respective compatibilities. Should the parameters of certain markers be determined incompatible at block 266 in view of the programmatic rules 49, then the computer 30 may prompt selection of alternative parameters at block 268. When all equipment has been successfully specified at block 270, then the plan may be outputted at block 272 to a printer or storage, for instance, electronic transmission.

FIG. 7 shows a flowchart 280 having an exemplary sequence of steps executable by the computer 30 for guiding the automatic selection of appropriate component parameters. FIG. 7 more particularly shows an equipment selection process that is driven by specified parameter needs. As such, the processes of the flowchart 280 in one embodiment could be included at block 262 of FIG. 6.

Turning more particularly to the flowchart 280, the computer 30 may prompt a selection of a parameter at block 282. If there is no previous parameter affecting the selection at block 282, then the computer 30 may prompt the user at block 288 to select a second parameter. Alternatively, if a preexisting parameter and associated programmatic rule affecting the first selection exists at block 284, then the computer 30 may at block 286 determine compatible parameters. Of note, the determined parameter may be a different parameter for the same marker as the first parameter, or alternatively, may be a parameter for a different marker. For instance, the computer 30 may determine an appropriate wattage load parameter for an applicator marker based upon a capacity parameter of a melter marker. In any case, the user may be prompted to select another parameter at block 288.

Using the selected parameters, the computer 30 at block 290 may determine a component having the specified parameters. The computer 30 may then display the determined equipment at block 292. The user may then select the equipment at block 294.

While the exemplary steps of FIGS. 6 and 7 are mostly discussed in a context of a computer, one skilled in the art will appreciate that a server computer may alternatively execute or assist with the execution of these or similar steps in a networked configuration. One skilled in the art will appreciate that certain steps of the flowcharts may be rearranged with respect to other steps, as well as be augmented and/or omitted in accordance with the principles of the present invention. That is, the sequence of the steps in the included flowcharts may be altered, to include omitting certain processes without conflicting with the principles of the present invention. Similarly, related or known processes can be incorporated to complement those discussed herein.

Moreover, while the present invention has been illustrated by the description of embodiments thereof, and while the embodiments have been described in considerable detail, it is not intended to restrict or in any way limit the scope of the appended claims to such detail. The invention in its broader aspects is, therefore, not limited to the specific details, representative apparatus and method, and illustrative examples shown and described. Accordingly, departures may be made from such details without departing from the spirit or scope of the general inventive concept.

Having described the invention, what is claimed is:

1. A method of configuring an adhesive dispensing system, the method comprising:
   displaying a plurality of components used in an adhesive dispensing system as a plurality of markers;
   receiving user input that selects a first adhesive dispensing system component marker and a second adhesive dispensing system component marker for a potential combination;
   using a programmatic rule to determine if the potential combination is appropriate to display in an associated relationship; and if so,
   displaying the first and second adhesive dispensing system component markers in the associated relationship; and
   generating a cost proposal based at least partially on the first and second adhesive dispensing system component markers.

2. The method of claim 1, wherein receiving user input that selects the first adhesive dispensing system component marker further comprises receiving user input selecting a graphic representative of a first adhesive dispensing system component using a graphical display interface.

3. The method of claim 2, wherein receiving user input selecting the graphic further comprises enabling the user to select the graphic using a drag and drop graphical display interface.

4. The method of claim 1, wherein receiving user input that selects the first adhesive dispensing system component marker further comprises receiving user input that selects text representative of a first component.

5. The method of claim 1, wherein receiving user input that selects the first adhesive dispensing system component marker further comprises prompting the user to select the first adhesive dispensing system component marker.

6. The method of claim 1, wherein receiving user input that selects the first adhesive dispensing system component marker further comprises enabling the user to select a marker representative of at least one of: a melter, a hose, an applicator, a nozzle, an extension hose, a drum unloader, a sensor and a meter.

7. The method of claim 1, further comprising saving the associated relationship within a memory.

8. The method of claim 1, further comprising automatically determining an installation time based at least partially on the first and second adhesive dispensing system component markers.

9. The method of claim 1, further comprising printing out at least one of the cost proposal and the associated relationship.

10. The method of claim 1, further comprising automatically determining a cost based at least partially on the first and second adhesive dispensing system component markers.

11. The method of claim 1, further comprising generating a fail signal if the potential combination is determined to be inappropriate.

12. A method of configuring an adhesive dispensing system, the method comprising:
 displaying a plurality of markers representative of components used in an adhesive dispensing system;
 receiving user input that selects a first marker from the plurality of markers;
 using a programmatic rule to determine a subset of the plurality of markers for a potential combination with the first marker;
 displaying the subset of markers to the user;
 receiving user input that selects a second marker from the subset of markers for the potential combination; and
 generating a cost proposal based at least partially on the first and second adhesive dispensing system component markers.

13. The method of claim 12, further comprising displaying the first and second markers in the associated relationship.

14. An apparatus for planning an adhesive dispensing system, comprising:
 a memory including a plurality of markers representative of components used in an adhesive dispensing system, and a programmatic rule associated with a first marker of the plurality of markers, wherein the programmatic rule is used to determine whether the first marker should be displayed in an associated relationship with a second marker of the plurality of markers; and
 a program resident in the memory, the program configured to receive user input that selects the first marker, to determine a subset of the plurality of markers using the programmatic rule for a potential combination with the first marker, to display the subset of markers to the user, to receive user input that selects a second marker from the subset of markers for the potential combination, and to generate a cost proposal based at least partially on the first and second adhesive dispensing system component markers.

15. The apparatus of claim 14, wherein the program is further configured to determine an installation time based at least partially on the first and second markers.

16. The apparatus of claim 14, wherein the first marker is representative of at least one of: a melter, a hose, an applicator, a nozzle, an extension hose, a drum unloader, a sensor and a meter.

17. An apparatus for planning an adhesive dispensing system, comprising:
 a memory including a plurality components used in an adhesive dispensing system represented by a plurality of markers, and a programmatic rule associated with a first adhesive dispensing system component marker of the plurality of markers, wherein the programmatic rule is used to determine whether the first adhesive dispensing system component marker should be displayed in an associated relationship with a second adhesive dispensing system component marker of the plurality of markers; and
 a program resident in the memory, the program configured to receive user input that selects the first adhesive dispensing system component marker for a potential combination with the second adhesive dispensing system component marker, to determine if the potential combination is appropriate, and if so, to display the first and second adhesive dispensing system component markers in the associated relationship, and to generate a cost proposal based at least partially on the first and second adhesive dispensing system component markers.

18. The apparatus of claim 17, wherein the program further comprises a graphical user interface program.

19. The apparatus of claim 17, wherein the first adhesive dispensing system component marker comprises at least one of text and a symbol.

20. A program product, comprising:
 a computer readable medium; and
 a program code configured to display a plurality of markers representative of components used in an adhesive dispensing system, the program code resident on the computer readable medium and configured to associate a first marker of the plurality of markers with a programmatic rule used to determine whether the first marker should be displayed in an associated relationship with a second marker of the plurality of markers, the program code being further configured to receive user input that selects the first marker, to automatically determine a subset of the plurality of markers—using the programmatic rule for a potential combination with the first marker, to display the subset of markers to the user to receive user input that selects a second marker from the subset of markers for the potential combination, and to generate a cost proposal based at least partially on the first and second adhesive dispensing system component markers.

21. A program product, comprising:
 a computer readable medium; and
 a program code configured to display a plurality of components used in an adhesive dispensing system as a plurality of markers, the program code resident on the computer readable medium and configured to associate a first adhesive dispensing system component marker of the plurality of markers with a programmatic rule used to determine whether the first adhesive dispensing system component marker should be displayed in an associated relationship with a second adhesive dispensing system component marker of the plurality of markers, the program code being further configured to receive user input that selects first adhesive dispensing system component marker for a potential combination with the second adhesive dispensing system component marker, to determine if the potential combination is appropriate, and if so, to display the first and second markers in the associated relationship, and to generate a cost proposal based at least partially on the first and second adhesive dispensing system component markers.

* * * * *

UNITED STATES PATENT AND TRADEMARK OFFICE
CERTIFICATE OF CORRECTION

PATENT NO. : 7,433,749 B2
APPLICATION NO. : 11/275761
DATED : October 7, 2008
INVENTOR(S) : Bentley Boger et al.

It is certified that error appears in the above-identified patent and that said Letters Patent is hereby corrected as shown below:

Column 1

Line 39, delete the first occurrence of "a".

Line 62, delete the first occurrence of "the".

Column 4

Line 35, change "makers" to --markers--.

Line 40, change "processes" to --process--.

Column 9

Line 64 Claim 17, after "plurality" insert --of--.

Column 10

Line 57 Claim 21, after "selects" insert --the--.

Signed and Sealed this

Twenty-fourth Day of March, 2009

JOHN DOLL
*Acting Director of the United States Patent and Trademark Office*